(12) United States Patent
Chen et al.

(10) Patent No.: US 7,445,468 B2
(45) Date of Patent: Nov. 4, 2008

(54) LOW PROFILE STRUCTURE

(75) Inventors: Chien-Jung Chen, Taipei (TW); Chih-Peng Wu, Taipei (TW); Yu-Liang Liu, Taipei (TW)

(73) Assignee: Asustek Computer Inc., Taipei (TW)

( * ) Notice: Subject to any disclaimer, the term of this patent is extended or adjusted under 35 U.S.C. 154(b) by 0 days.

(21) Appl. No.: 11/432,353

(22) Filed: May 12, 2006

(65) Prior Publication Data
US 2006/0270251 A1   Nov. 30, 2006

(30) Foreign Application Priority Data
May 31, 2005   (TW) .............................. 94117853 A

(51) Int. Cl.
*H01R 12/00* (2006.01)
(52) U.S. Cl. ........................................ 439/76.1; 439/65
(58) Field of Classification Search .................. 439/65, 439/74, 75, 76.1, 507
See application file for complete search history.

(56) References Cited
U.S. PATENT DOCUMENTS

| 3,475,657 | A | * | 10/1969 | Knowles | ..................... 361/787 |
|---|---|---|---|---|---|
| 3,582,865 | A | * | 6/1971 | Franck et al. | ................. 439/67 |
| 5,046,955 | A | * | 9/1991 | Olsson | ........................ 439/74 |
| 5,329,428 | A | * | 7/1994 | Block et al. | ................. 361/785 |
| 5,384,484 | A | * | 1/1995 | Haug | ......................... 257/690 |
| 5,536,178 | A | * | 7/1996 | Novelli | ........................ 439/74 |
| 6,256,208 | B1 | * | 7/2001 | Supinski et al. | ............. 361/784 |
| 6,364,713 | B1 | * | 4/2002 | Kuo | ........................... 439/638 |
| 6,705,878 | B2 | * | 3/2004 | Liang | ........................ 439/76.1 |
| 7,149,093 | B2 | * | 12/2006 | Conway | ..................... 361/788 |

* cited by examiner

*Primary Examiner*—Tho D. Ta
*Assistant Examiner*—Travis Chambers
(74) *Attorney, Agent, or Firm*—Bacon & Thomas, PLLC

(57) ABSTRACT

A low profile structure is disclosed. The structure includes a printed circuit board (PCB), a bracket, three connectors and an extending module, wherein the bracket is connected to the PCB to form the body of the low profile structure. In addition, one of the connectors is an extending connector and the other two connectors are configured on the bracket and are directly connected with PCB. The extending module further includes an extending PCB so that the extending PCB is electrically connected to the extending connector and the extending PCB is electrically connected to PCB. Therefore, the extending connector can be electrically connected to PCB via the extending PCB.

20 Claims, 5 Drawing Sheets

LOW PROFILE STRUCTURE

BACKGROUND OF THE INVENTION

1. Field of the Invention

The present invention relates generally to a low profile structure and, more particularly, to such a profile structure having an extending connector.

2. Description of Related Art

Due to the design limitation, a low profile external card has a width capable of accommodating two connectors only. In many cases, a third connector may be necessary for a low profile external card, for example, a multipurpose display card of low profile design requires a VGA connector, an RCA connector and a DVI connector. According to the present techniques, it is difficult to add an extending connector (third connector) to a low profile external card.

Currently, there are two ways to add a third connector to an external card.

FIG. 1 is a schematic drawing showing a third connector connected to an external card according to a prior art design. As illustrated, the external card 1 includes a PCB (printed circuit board) 11, a first connector 121, a second connector 122 and a third connector 123, wherein the PCB 11 has a first area 111 and a second area 112.

The first connector 121, the second connector 122 and the third connector 123 are connected to the PCB 11 physically, i.e., the respective pins of the first connector 121, second connector 122 and third connector 123 are directly connected to the PCB 11.

The width d1 of the first area 111 is the width of a standard low profile structure. Because of the low profile design, the width d1 of the first area 111 can only accommodate the first connector 121 and the second connector 122. In order to accommodate the third connector 123 on the PCB 11, this design adopts a known Full High PCB design, i.e., the external card 1 has the aforesaid second area 112 extending from the first area 111 for the installation of the third connector 123. However, this design is not a low profile design. Further, the extra material for the second area 112 greatly increases the manufacturing cost of the PCB 11.

FIG. 2 is a schematic drawing showing a third connector added to an external card according to another prior art design. According to this design, the external card 2 includes a PCB 21, a first connector 221, a second connector 222 and a third connector 223. The first connector 221 and the second connector 222 are directly connected to the PCB 21, i.e., the other end 2211 of the first connector 221 and the other end 2221 of the second connector 222 are provided at the top of the PCB 21 and their pins are directly connected to the PCB 21.

Please note that the aforesaid third connector 223 is not directly connected to the external card 2. Namely, the width d3 of the PCB 21 is the width of a standard low profile structure that does not accommodate the third connector 223. Therefore, the third connector 223 is electrically connected to the PCB 21 through a flat cable 23.

This low profile external card saves a significant amount of PCB material, however because the PCB 21 has many high-frequency signal circuits, capacitors and inductors, suspending the flat cable? over these high-frequency signal circuits, capacitors or inductors may cause interference with the signal transmitting from the flat cable 23 to the third connector 223, and such interference may result in a signal error, affecting circuit operation.

Therefore, it is desirable to provide a low profile external card having the third connector that has a low manufacturing cost and high signal quality

SUMMARY OF THE INVENTION

An object of the present invention is to provide a low profile structure so as to reduce the manufacturing cost of an external card.

Another object of the present invention is to provide a low profile structure so as to improve the signal quality between the extending connector and the PCB.

A further object of the present invention is to provide a low profile structure so as to improve the installation between the extending connector and the extending module.

According to one aspect of the present invention, a low profile structure is provided, which comprises a PCB, a bracket, a first connector and an extending module. The bracket and the PCB are connected together. The first connector is mounted in the bracket, and electrically connected to the PCB through the extending module. The extending module includes an extending PCB. The extending PCB is electrically connected to the PCB and the first connector, respectively.

According to another aspect of the present invention, a low profile structure is provided, which comprises a PCB, a bracket, a first connector and an extending module. The PCB includes an output unit disposed at one lateral side thereof. The PCB and the bracket are connected together. The first connector is mounted in the bracket corresponding to the same side of the output unit at the PCB. The extending module includes an extending PCB through which the first connector is electrically connected to the output unit of the PCB.

According to still another aspect of the present invention, a low profile structure is provided, which comprises a PCB, a bracket, a first connector and an extending module. The bracket and the PCB are connected together. The extending module includes an extending PCB electrically connected to the PCB. The first connector is mounted in the bracket, and electrically connected to the extending PCB of the extending module. The first connector is electrically connected to the extending PCB through multiple sets of leads. These multiple sets of leads include two sets of leads that are respectively set at two opposite sides of the extending PCB, and the distance between these two sets of leads is equal to the thickness of the extending PCB.

Further, the low profile structure further includes a second connector and a third connector respectively mounted in the bracket and directly electrically connected to the PCB. The extending module further includes a cover shell. The cover shell has a shape fitting the shape of the extending PCB, for example, the extending PCB has a P-shaped profile, and the cover shell also has a P-shaped profile. The cover shell can be made of rubber, plastics, or metal.

Further, the extending PCB is electrically connected to the first connector by leads, for example, the extending PCB is electrically connected to the first connector through a first set of leads, a second set of leads and a third set of leads. The second set of leads is soldered to the top surface of the extending PCB. The third set of leads is soldered to the bottom surface of the extending PCB. The thickness of the extending circuit board (i.e., the distance between the second set of leads and the third set of leads) can be 0.9 mm. Of course, the thickness of the extending printed circuit board may be changed to fit a different manufacturer's design, and the distance between the second set of leads and the third set of leads shall be adjusted subject to the thickness of the extending printed circuit board. Further, the extending PCB is electrically connected to the PCB through a plurality of contact pins. The first connector can be a VGA (Video Graphics Array) connector.

DETAILED DESCRIPTION OF THE PREFERRED EMBODIMENT

Figure 1:
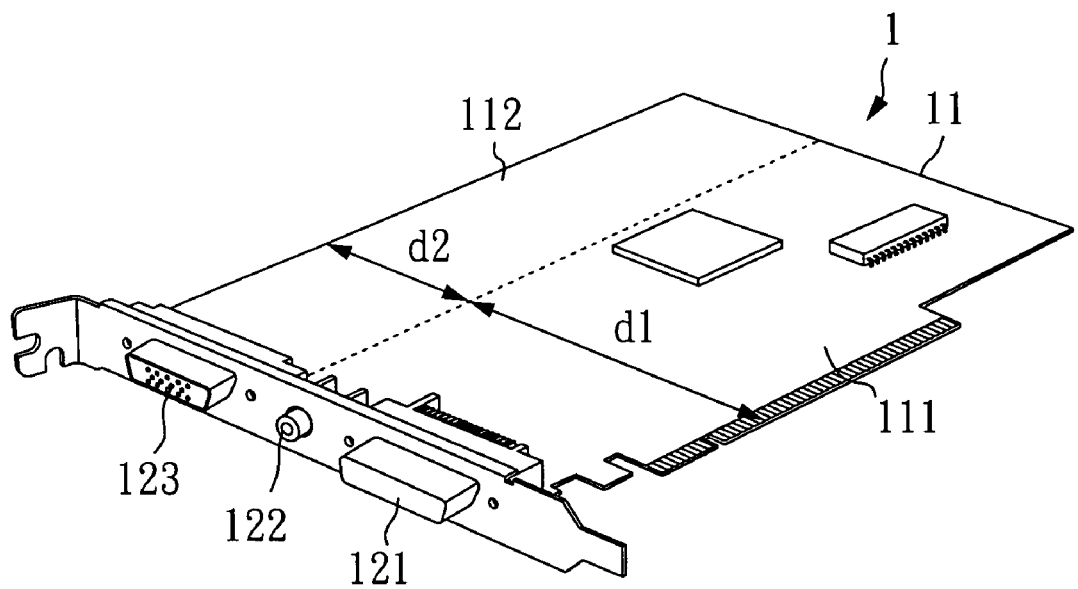
FIG. 1 is a schematic drawing showing a third connector connected to an external card according to a prior art design.
Figure 2:
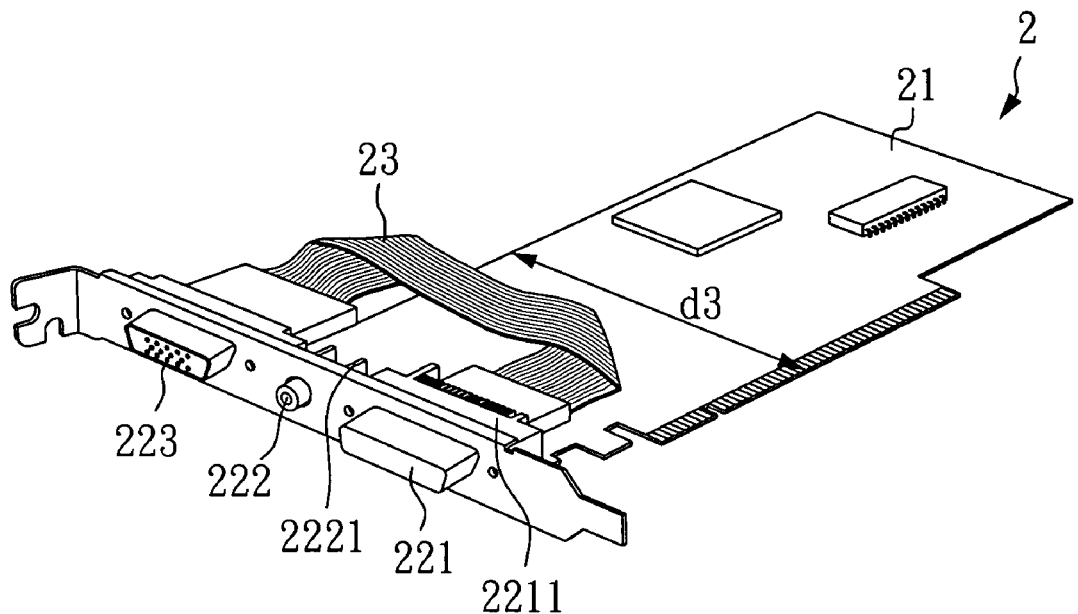
FIG. 2 is a schematic drawing showing a third connector added to an external card according to another prior art design.
Figure 3:
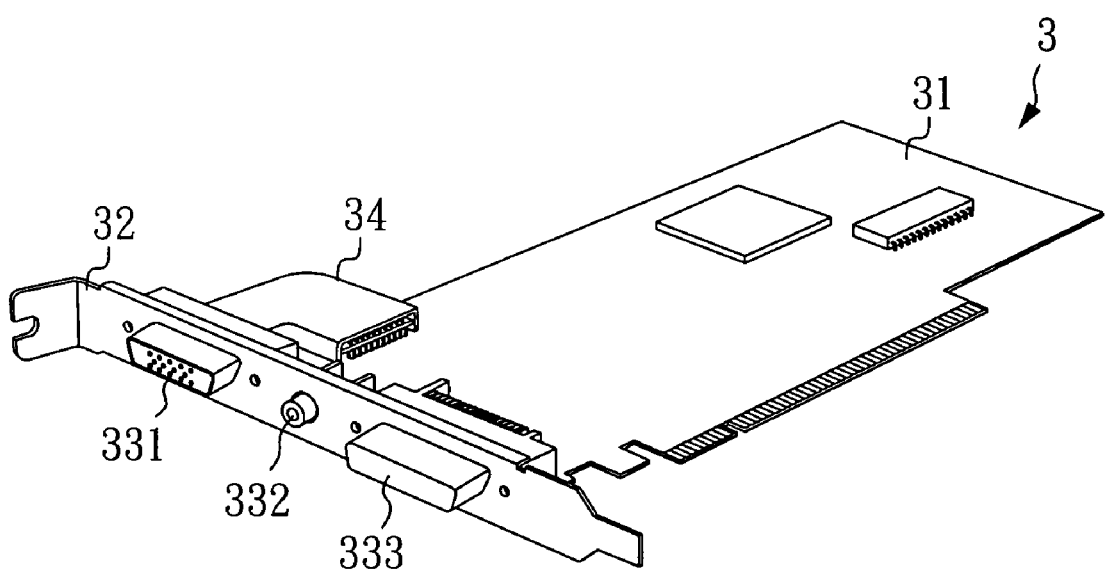
FIG. 3 is a perspective view of a low profile structure according to the present invention.

Referring to FIG. 3, a low profile structure 3 in accordance with the present invention is shown, which includes a printed circuit board (PCB) 31, a bracket 32, a first connector 331, a second connector 332, a third connector 333 and an extending module 34. According to this embodiment, the low profile structure 3 is applied as an external card capable of being plugged into an external card slot of a computer.

The PCB 31 and the bracket 32 are fastened together, forming the body of the low profile structure 3 (i.e., forming the body of an external card) so that the low profile structure 3 is connectable to an external card slot of a computer. The first connector 331, the second connector 332 and the third connector 333 are mounted in the bracket 32, wherein the first connector 331 is connected to the PCB 31 through the extending module 34. The second connector 332 and the third connector 333 are electrically connected to the PCB 31 directly.

In this embodiment, the second connector 332 and the third connector 333 are the two connectors normally receivable in the low profile structure 3, and the first connector 331 is an added connector (extending connector) relative to the low profile structure 3. The first connector 331 according to this embodiment is a VGA (Video Graphics Array) connector, or the so-called D-SUB terminal that has 15 pins. In other embodiments of the present invention, the first connector 331 can be an RJ-45 connector, USB (Universal Serial Bus) connector, 1394 connector, or any of a variety of other connectors.

Figure 4:
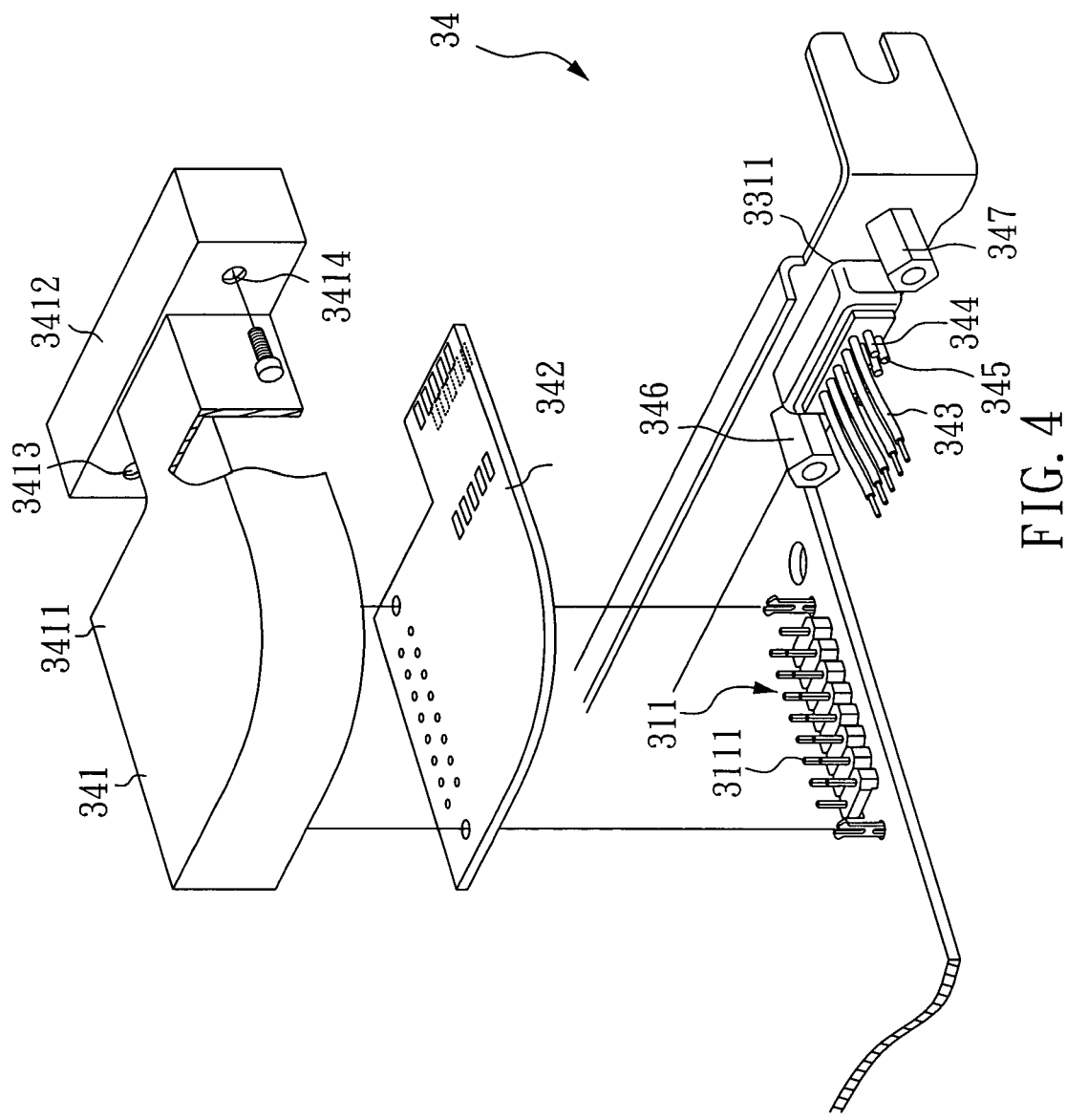
FIG. 4 is an exploded view of the low profile structure according to the present invention.

FIG. 4 is an exploded view of the extending module 34. According to this embodiment, the extending module 34 includes a cover shell 341 and an extending printed circuit board 342. The cover shell 341 includes a main cover shell portion 3411, and an extending cover shell portion 3412 formed integrally with the main cover shell portion 3411. In this embodiment, the cover shell 341 is molded from rubber. Plastics or metal may be used as a substitute for making the cover shell 341.

The aforesaid extending printed circuit board 342 is a mini printed circuit board disposed near one lateral side of the PCB 31. The PCB 31 includes an output unit 311 for signal output. The extending printed circuit board 342 is electrically connected to the PCB 31 through contact pins 3111 at the output unit 311. Further, the extending printed circuit board 342 is electrically connected to the other end 3311 of the first connector 331 through a first set of leads 343, a second set of leads 344 and a third set of leads 345, so that signals coming from the PCB 31 can be transmitted to the extending printed circuit board 342 through the output unit 311 and then the first connector 331. In other alternative forms of the present invention, an input unit is used to substitute for the output unit 311, such that the first connector 331 can receive an external signal, enabling the received external signal to be transmitted to the PCB 31 through the first connector 331 and the extending printed circuit board 342.

According to this embodiment, the first connector 331 is a 15-pin D-SUB connector, and thus at least 15 leads must be used to electrically connect the first connector 331 to the extending printed circuit board 342. The connection between the extending printed circuit board 342 and the first connector 331 by means of leads will be described hereinafter.

The main cover shell portion 3411 has a shape fitting the shape of the extending printed circuit board 342 so that the main cover shell portion 3411 can be capped on the extending printed circuit board 342 to protect the extending printed circuit board 342 against external force. Further, the extending cover shell portion 3412 is adapted to shield the other end 3311 of the first connector 331, mounting posts 346 and 347, a part of the first set of leads 343 and a part of the second set of leads 344. The extending cover shell portion 3412 has a first mounting through hole 3413 and a second mounting through hole 3414 configured corresponding to the mounting posts 346 and 347 respectively. When the extending cover shell 3412 is capped on the other end 3311 of the first connector 331, screws are respectively inserted through the first mounting through hole 3413 and the second mounting through hole 3414 and respectively threaded into the mounting ports 346 and 347 to affix the extending cover shell portion 3412 to the bracket 32.

According to this embodiment, the extending printed circuit board 342 has a substantially P-shaped profile; therefore the main cover shell portion 3411 has a P-shaped profile. Alternatively, the extending printed circuit board 342 can be made to have an L-shaped profile or other suitable profile. In this case, the shape of main cover shell portion 3411 is changed correspondingly.

Figure 5:
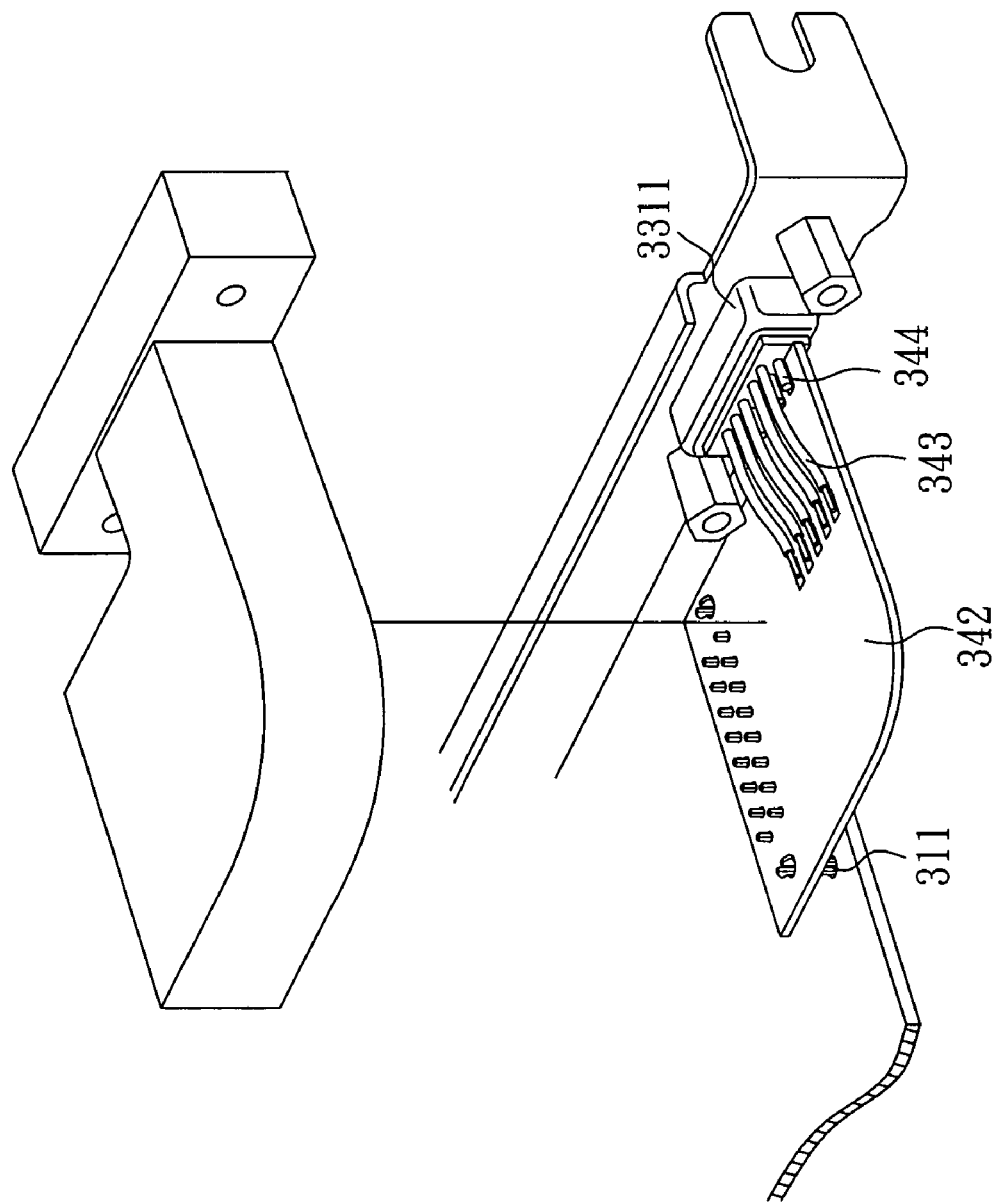
FIG. 5 is a schematic drawing of the present invention, showing electric connection of the extending printed circuit board with the printed circuit board and the first connector.

FIG. 5 is a schematic drawing showing electrical connection of the extending printed circuit board 342, the PCB 31 and the first connector 331. The output unit 311 of the PCB 31 is provided at one lateral side of the PCB 31. The first connector 331 is disposed corresponding to the same lateral side of the PCB 31 to shorten the distance between the first connector 331 and the output unit 311. For example, if the first connector 331 is set at the right side relative to the PCB 31 (in the right upper corner of the low profile structure 3), the output unit 311 must be disposed in the right upper corner of the PCB 31 near the first connector 331. By means of this design, electrical connection between the first connector 331 and the output unit 311 can be done through the extending printed circuit board 342.

The output unit 311 of the PCB 31 is electrically connected to the extending printed circuit board 342 through the contact pins 3111 (i.e., the contact pins 3111 are inserted into the extending printed circuit board 342), allowing transmission of signals between the extending printed circuit board 342 and the PCB 31. Further, the first set of leads 343 electrically connects the other end 3311 of the first connector 331 to the extending printed circuit board 342. One end of the first set of leads 343 is soldered to the extending printed circuit board 342. The second set of leads 344 electrically connects the other end 3311 of the first connector 331 to the extending printed circuit board 342.

Figure 6:
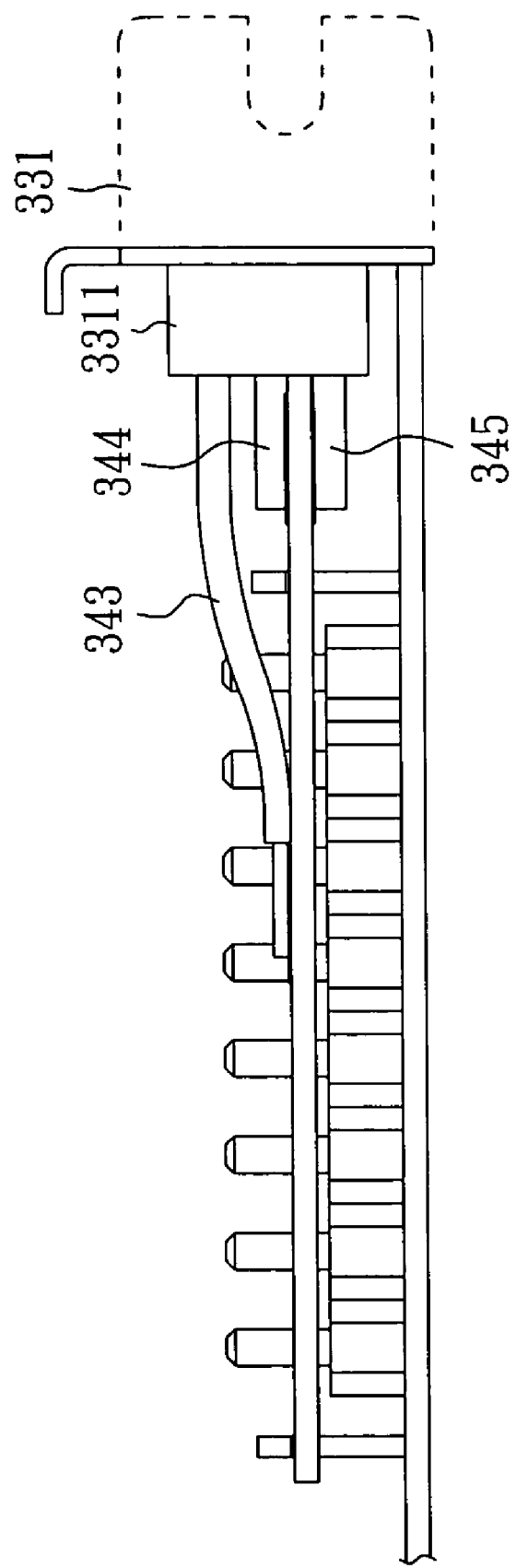
FIG. 6 is a schematic drawing of the present invention, showing electric connection of the extending printed circuit board with the first connector.

FIG. 6 is a schematic drawing showing electric connection between the extending printed circuit board 342 and the first connector 331. The first set of leads 343, the second set of leads 344 and the third set of leads 345 are respectively electrically connected between the extending circuit board 342 and the first connector 331. The first set of leads 343 and the second set of leads 344 are disposed at the top side of the extending printed circuit board 342. The third set of leads 345 is disposed at the bottom side of the extending printed circuit board 342. Further, the distance between the second set of leads 344 and the third set of leads 345 is equal to the thickness of the extending printed circuit board 342. For example, the distance between the second set of leads 344 and the third set of leads 345 is 0.9 mm. In practical application, the thickness of the extending printed circuit board 342 may be changed to fit a different manufacturer's design, and the distance between the second set of leads 344 and the third set of leads 345 shall be adjusted subject to the thickness of the extending printed circuit board 342.

The second set of leads 344 and the third set of leads 345 are directly soldered to the extending printed circuit board 342, i.e., the second set of leads 344 is extended out of the other end 3311 of the first connector 331 and soldered to the top surface of the extending printed circuit board 342. Similarly, the third set of leads 345 is extended out of the other end 3311 of the first connector 331 and soldered to the bottom surface of the extending printed circuit board 342.

In this embodiment, the second set of leads 334 and the third set of leads 335 are respectively formed of a plurality of metal strips that are extended out of the other end 3311 of the first connector 331 and respectively soldered to the top and bottom surfaces of the extending printed circuit board 342. Alternatively, the second set of leads 334 and the third set of leads 335 can be formed of connecting lines (or electric wires), or other connection methods may be employed to achieve electrical connection between the first connector 331 and the extending printed circuit board 342.

Because the first connector 331 is a 15-pin D-SUB connector according to this embodiment, the aforesaid leads are necessary to achieve electrical connection between the extending printed circuit board 342 and the first connector 331. In other embodiments, the first connector 331 can be any of a variety of other types of connectors, therefore the electrical connection between the extending printed circuit board 342 and the first connector 331 may be done through a different number of leads, by means of direct connection between the extending printed circuit board 342 and the first connector 331 (for example, through metal strips that are directly bonded to the extending printed circuit board 342), or by means of any of a variety of other connection measures. Alternatively, the connection between the extending printed circuit board 342 and the PCB 31 can be done through connecting wires, metal strips, pins, or the like.

In view of the foregoing, it is known that the invention is applicable to a low profile external card, and provides an extending PCB as a connecting medium between the extending connector and the external card so that the PCB of the external card can transmit signals to the third connector through the extending PCB, or the third connector can transmit signals to the PCB of the external card via the extending PCB. Therefore, the invention saves a significant amount of PCB material for the external card, reduces the manufacturing cost of the external card, and improves the signal quality between the extending connector (first connector) and the PCB.

Although the present invention has been explained in relation to its preferred embodiment, it is to be understood that many other possible modifications and variations can be made without departing from the spirit and scope of the invention as hereinafter claimed.

What is claimed is:

1. A low profile structure comprising:
    a low profile printed circuit board for plugging into a computer, said printed circuit board having a width defined between lateral edges of said printed circuit board;
    a bracket connected to the low profile printed circuit board;
    at least one connector mounted in the bracket between said lateral edges;
    another connector mounted in the bracket; and
    an extending module including an extending printed circuit board;
    wherein the extending module is electrically connected to the low profile printed circuit board and said another connector, the another connector and the extending module are located at a same lateral side of the low profile printed circuit board, the another connector is located outside said lateral edges, and said extending module extends from said low profile printed circuit board outside said lateral edges to said another connector.

2. The low profile structure as claimed in claim 1, wherein the extending module further includes a cover shell capped on the extending printed circuit board.

3. The low profile structure as claimed in claim 1, further comprising third connector respectively mounted in the bracket and electrically connected to the low profile printed circuit board.

4. The low profile structure as claimed in claim 1, wherein the extending printed circuit board is only electrically connected to the another connector through a plurality of leads.

5. The low profile structure as claimed in claim 1, wherein the extending printed circuit board is electrically connected to the low profile printed circuit board through a plurality of contact pins.

6. The low profile structure as claimed in claim 1, wherein the another connector is a VGA (Video Graphics Array) connector.

7. The low profile structure as claimed in claim 1, wherein the extending printed circuit board is only electrically connected to the another connector through a first set of leads, a second set of leads and a third set of leads, the second set of leads being soldered to a top surface of the extending printed circuit board, the third set of leads being soldered to a bottom surface of the extending printed circuit board.

8. The low profile structure as claimed in claim 1, wherein the extending module further includes a cover shell having a shape fitting the shape of the extending printed circuit board.

9. The low profile structure as claimed in claim 8, wherein the cover shell is made of rubber, plastics, or metal.

10. A low profile structure comprising:
    a low profile printed circuit board for plugging into a computer, said printed circuit board having a width defined between lateral edges of said printed circuit board;
    a bracket comprising a first part and a second part, wherein said first part is connected to said low profile printed circuit board within said lateral edges and said second part on a space area outside said lateral edges;
    a first connector mounted in the first part of said bracket;

another connector mounted in the said second part of said bracket; and an extending module including an extending printed circuit board to connect the low profile printed circuit board and the another connector, wherein the another connector and the extending module are located at a same lateral side of the low profile printed circuit board and said extending module extends from said low profile printed circuit board outside said lateral edges to said another connector.

11. The low profile structure as claimed in claim 10, further comprising a third connector respectively mounted in the bracket and electrically connected to the low profile printed circuit board.

12. The low profile structure as claimed in claim 10, wherein the extending printed circuit board is only electrically connected to the another connector through a plurality of leads.

13. The low profile structure as claimed in claim 10, wherein the extending printed circuit board is electrically connected to the low profile printed circuit board through a plurality of contact pins.

14. The low profile structure as claimed in claim 10, wherein the first connector is a VGA (Video Graphics Array) connector.

15. A low profile structure comprising:

a low profile printed circuit board for plugging into a computer, said printed circuit board having a width defined between lateral edges of said printed circuit board;

a bracket connected to the low profile printed circuit board;

a first connector mounted in the bracket between said lateral edges;

an extending module including an extending printed circuit board electrically connected to the low profile printed circuit board; and another connector mounted in the bracket and only electrically connected to the extending printed circuit board of the extending module;

wherein the another connector is only electrically connected to the extending printed circuit board through a plurality of leads, the leads including two sets of leads respectively disposed at two opposite sides of the extending printed circuit board and a distance between the two leads being equal to the thickness of the extending printed circuit board; and the another connector and the extending module are located at a same lateral side of the low profile printed circuit board.

16. The low profile structure as claimed in claim 15, further comprising a third connector respectively mounted in the bracket and electrically connected to the low profile printed circuit board.

17. The low profile structure as claimed in claim 15, wherein the extending printed circuit board is electrically connected to the low profile printed circuit board through a plurality of contact pins.

18. The low profile structure as claimed in claim 15, wherein the another connector is a VGA (Video Graphics Array) connector.

19. The low profile structure as claimed in claim 15, wherein the extending module further includes a cover shell having a shape fitting the shape of the extending printed circuit board.

20. The low profile structure as claimed in claim 15, wherein the distance between the two sets of leads is 0.9 mm.

* * * * *